United States Patent [19]
Brown

[11] Patent Number: 5,256,985
[45] Date of Patent: Oct. 26, 1993

[54] CURRENT COMPENSATION TECHNIQUE FOR AN OPERATIONAL AMPLIFIER

[75] Inventor: Charles A. Brown, Corvallis, Oreg.

[73] Assignee: Hewlett-Packard Company, Palo Alto, Calif.

[21] Appl. No.: 929,875

[22] Filed: Aug. 11, 1992

[51] Int. Cl.$^5$ .................................. H03F 1/34
[52] U.S. Cl. ................................ 330/260; 330/293
[58] Field of Search .............. 330/75, 108, 255, 260, 330/293

[56] References Cited

U.S. PATENT DOCUMENTS

| | | | |
|---|---|---|---|
| 4,110,677 | 8/1978 | Boronkay et al. | 323/19 |
| 4,215,317 | 7/1980 | Traynor | 330/260 X |
| 4,446,419 | 5/1984 | van de Plassche et al. | 323/316 |
| 4,506,208 | 3/1985 | Nagano | 323/314 |
| 4,896,094 | 1/1990 | Greaves et al. | 323/314 |
| 4,902,959 | 2/1990 | Brokaw | 323/314 |
| 4,928,056 | 5/1990 | Pease | 323/314 |
| 4,978,868 | 12/1990 | Giordano et al. | 307/296.6 |
| 4,987,379 | 1/1991 | Hughes | 330/253 |
| 5,051,686 | 9/1991 | Schaffer | 323/313 |
| 5,107,199 | 4/1992 | Vo et al. | 323/315 |

Primary Examiner—James B. Mullins

[57] ABSTRACT

An apparatus and method is disclosed for minimizing the loading effect of the feedback network on the output voltage of an op-amp circuit. A single current source is coupled to the output of the op-amp to provide a predetermined current. By properly selecting the current source to be equal to the current demanded by the feedback network, the output current of the op-amp is significantly reduced. In turn, the loading effects of the feedback network resistors on the op-amp are significantly reduced and the accuracy of the op-amp circuit gain is improved.

12 Claims, 5 Drawing Sheets

CURRENT COMPENSATION TECHNIQUE FOR AN OPERATIONAL AMPLIFIER

BACKGROUND OF THE INVENTION

This invention relates generally to operational amplifier (op-amp) circuits and more particularly to those op-amp circuits in which the op-amp has high output impedance and/or low output current driving capability.

Op-amps are widely used in numerous circuit applications. One application is to precisely amplify a known voltage level, such as a fixed, temperature compensated bandgap voltage or other fixed reference voltage, to generate different desired voltage levels. These different voltage levels can be used, for example, as bias voltages within an integrated circuit. An op-amp circuit for precisely amplifying an input voltage by a predetermined positive factor, which is well known in the art, is shown in FIG. 1. An op-amp 10 has a positive input 12 for receiving an input voltage $V_{IN}$, a negative input 18, and an output 14 for providing the desired output voltage, $V_{OUT}$. A resistive feedback network includes resistors R1 and R2, which determine the positive closed-loop gain of the op-amp circuit. Resistor R2 is coupled between the output node 14 and the negative input 18, and resistor R1 is coupled between the negative input 18 and a reference voltage source at circuit node 16. The reference voltage is typically ground, but can be set to other voltage levels depending upon the application.

Assuming that op-amp 10 shown in FIG. 1 is an ideal op-amp, the following simplifying assumptions can be made: the voltage differential between the positive and negative inputs 12 and 18 of the op-amp 10 is zero; the open loop gain is infinite; the input impedance is infinite; the output impedance is zero; and the output driving capability is infinite. Under these ideal conditions, the output voltage of op-amp 10, $V_{OUT}$, is a non-inverting function of the input voltage $V_{IN}$ as follows:

$$V_{OUT} - V_{REF} = (V_{IN} - V_{REF}) \times (R1 + R2)/R1 \quad [1]$$

The transfer function is thus dependent upon the ratio of resistors R1 and R2, which makes the op-amp circuit suitable for fabrication on an integrated circuit.

One simple transistor-level implementation of the op-amp circuit of FIG. 1 is circuit 20 shown in FIG. 2. Circuit 20 includes a simple differential amplifier that provides the relatively high gain of the op-amp. The differential amplifier includes emitter-coupled transistors Q1 and Q2 in the well known differential pair configuration. The base of transistor Q1 is the positive input of the op-amp, the base of transistor Q2 is the negative input of the op-amp, and the collector of transistor Q2, which is coupled to load resistor $R_L$ at circuit node 32, is the output of the op-amp. Bias current, $I_{BIAS}$, for transistors Q1 and Q2 is provided by current source 22. A buffer stage 28 has an input coupled to the load resistor $R_L$ and an output that forms the output of the op-amp at circuit node 14. The buffer stage 28 has a high input impedance and a low output impedance, which buffers the loading of the feedback resistors R1 and R2 on circuit node 32. In addition to the buffer stage 28, other gain stages can be included to increase the overall open-loop gain of the op-amp. The feedback resistors R1 and R2 are coupled to the negative input and the output of the op-amp as shown in FIG. 1 to provide a non-inverting gain that is a function of resistors R1 and R2.

The following two circuit examples using circuit 20 illustrate the loading effects of the feedback resistors R1 and R2 on the output of the op-amp. (The following two examples are merely illustrative of the loading effect and any number of op-amp circuit configurations or operating conditions could be presented.) Assume in a first example that an ideal output section 28 is included in op-amp circuit 20 (infinite input impedance and zero output impedance, as well as infinite current drive capabilities) and the following circuit component values and operating conditions exist:

$V_{DD} = 10V$
$V_{REF} = 0V$
$R_L = 10K \, \Omega$
$R_2 = 1K \, \Omega$
$R_1 = 1K \, \Omega$
$V_{IN} = 2.5V$
$I_{BIAS} = 1 \, mA$ The closed loop gain of op-amp circuit 20 is therefore two and the output voltage is equal to five volts.

Since the base-emitter voltage of the transistors Q1 and Q2 are approximately equal, the current supplied by the current source 22 divides equally between the two transistors, i.e., 500 $\mu$A flows through each transistor. Therefore, the voltage drop across the load resistor $R_L$ is 500 $\mu A \times 10K\Omega = 5$ volts, and the corresponding voltage at the collector of transistor Q2 (circuit node 32) is also 5 volts (10 volts at $V_{DD}$ minus 5 volts across load resistor $R_L$). The voltage at circuit node 32 is buffered at the output node 14 by output section 28. Output section 28 delivers all of the current required by the feedback resistance network ($I_F$), which is equal to:

$$I_F = (V_{OUT} - V_{REF})/(R2+R1) = 5V/(1K\Omega + 1K\Omega) = 2.5 \, mA \quad [2]$$

Note that the current $I_{32}$ supplied at circuit node 32 to the input of the buffer is zero.

For ease of implementation on an integrated circuit, however, and to conserve integrated circuit area, the output section 28 can have limited current drive capability and/or high output impedance. Sometimes the output section 28 is eliminated entirely, especially on an integrated circuit that has a multiplicity of other functions, due to the size consumed by the output section. In this case, node 32 is shorted directly to the output node 14. A simple op-amp is therefore the differential amplifier including only transistors Q1 and Q2, current source 22 and load resistor $R_L$.

In the following second example, output section 28 is eliminated and circuit node 32 is shorted directly to output node 14. The current through the load resistor is labeled $I_{RL}$, the current supplied by the collector of transistor Q2 is labeled $I_{Q2}$, and the current at the output of the op-amp is now equal to $I_F$, which is the current required by the feedback network. The following equations describe the new operating condition:

$$I_{RL} = I_{Q2} + I_F \quad [3]$$

$$I_{RL} = (V_{DD} - V_{OUT})/R_L \quad [4]$$

$$I_F = (V_{OUT} - V_{REF})/(R1+R2) \quad [5]$$

Rearranging the terms in equations [3]–[5] yields a single equation for calculating the output voltage:

$$V_{OUT} = ((R_L \times (R1+R2))/(R_L+R1+R2)) \times ((V_{DD}/R_L) + V_{REF}/(R1+R2) - I_{Q2}) \quad [6]$$

For the same operating conditions as set forth above in the first example, the elimination of the output section produces a new output voltage equal to 2.27 volts, which is unacceptable for use as a precision reference or bias voltage. Note also that the output voltage expression is a function of the load resistance, the current flowing through the collector of transistor Q2, and the positive power supply voltage, all of which can change and affect the accuracy of the output voltage.

Common approaches to solving this problem are to include an output section 28 having a low output impedance and high current driving capability. This solution restores the precision output voltage and the original gain expression, but can consume significant integrated circuit area due to the size of the required output current driving transistors and associated circuitry. Another solution is to increase the resistance of resistors R1 and R2 in the feedback network, which also has similar size problems. In addition, the increased resistance can increase noise. Yet another solution is to increase the bias current $I_{BIAS}$, which undesirably increases circuit power dissipation. Each of these solutions require significant additional circuitry, and therefore silicon area, or impose other problems or limitations on the circuit.

Accordingly, a need remains for minimizing the loading effect of the feedback network on the output voltage of op-amp circuits in which the op-amp has a simple output section, or lacks an output section entirely, that is easily fabricated on an integrated circuit and consumes a minimum amount of silicon area.

SUMMARY OF THE INVENTION

It is, therefore, an object of the invention to provide a simple method and apparatus for minimizing the loading effect of the feedback network on op-amp circuits.

It is an advantage of the invention that the circuit solution for minimizing the loading effect is easily implemented in an integrated circuit.

According to the present invention, an apparatus and method is disclosed for minimizing the loading effect of the feedback network on the output voltage of an op-amp circuit. A single current source is coupled to the output of the op-amp to provide a predetermined current. By properly selecting the current source to be equal to the current demanded by the feedback network, the output current of the op-amp is significantly reduced. In turn, the loading effects of the feedback network resistors on the op-amp are significantly reduced and the accuracy of the op-amp circuit gain is improved.

The foregoing and other objects, features and advantages of the invention will become more readily apparent from the following detailed description of a preferred embodiment of the invention which proceeds with reference to the accompanying drawings.

DETAILED DESCRIPTION

Figure 1:
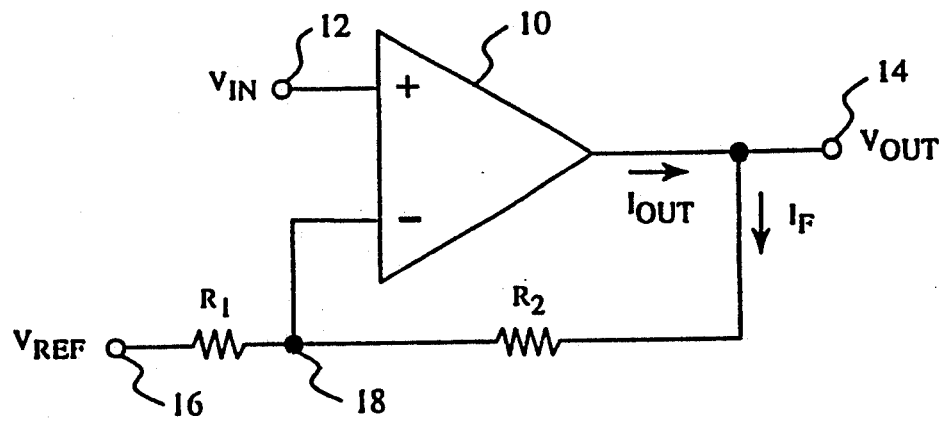
FIG. 1 is a schematic diagram of an op-amp circuit including a feedback network configured to provide a predetermined positive voltage gain.
Figure 3:
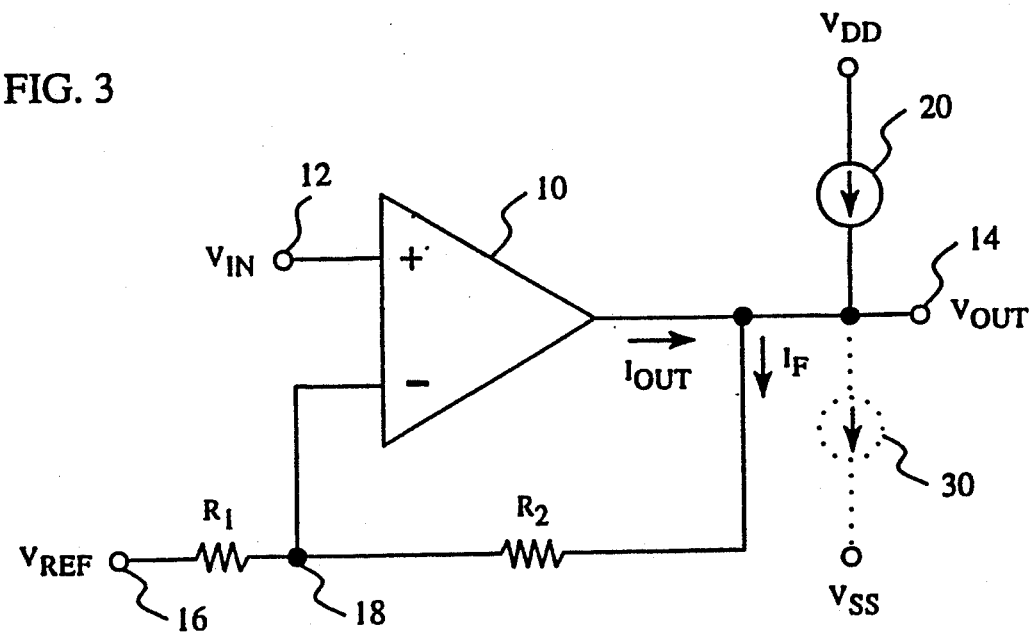
FIG. 3 is schematic of a first op-amp circuit including a current source for providing bias current to the feedback network according to the present invention.
Figure 2:
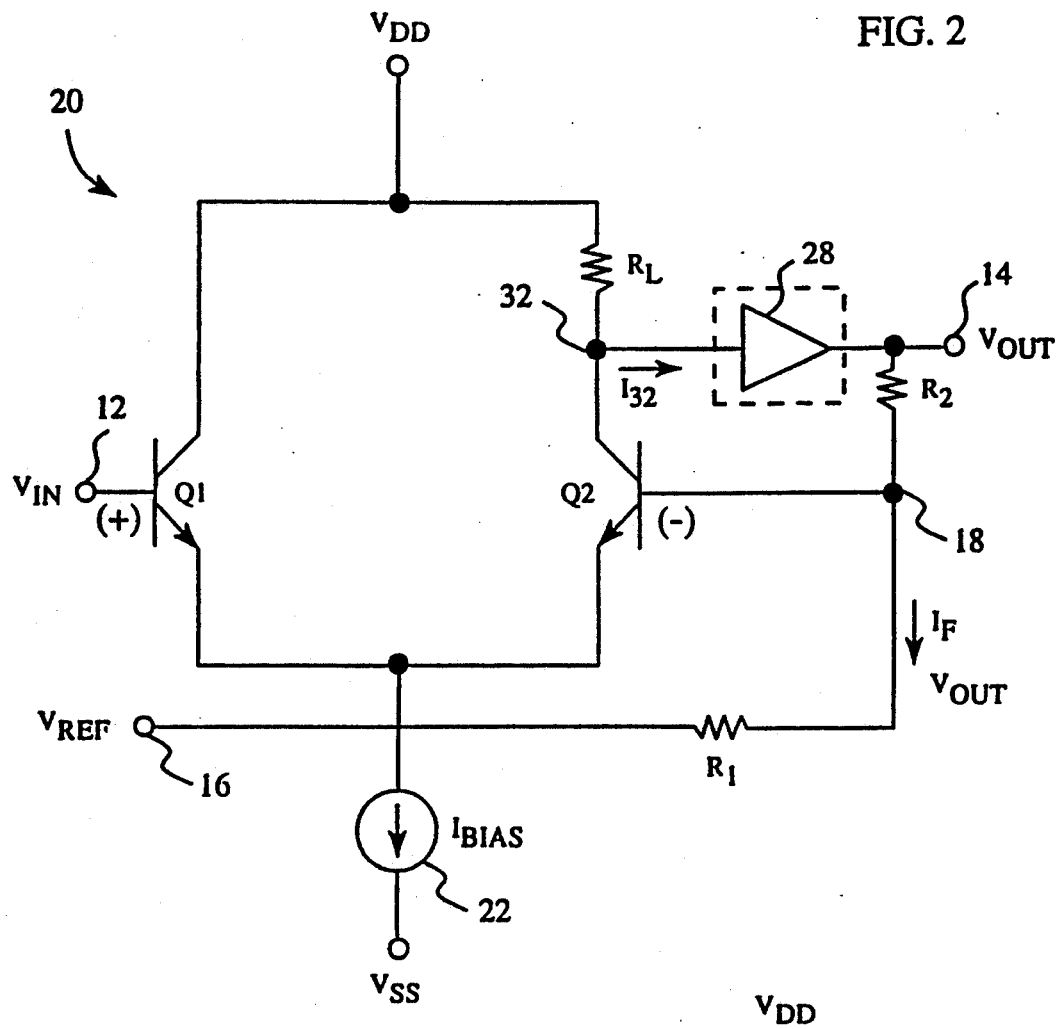
FIG. 2 is a schematic diagram of a transistor-level circuit implementation of the op-amp circuit of FIG. 1.

Referring now to FIG. 3, a simplified op-amp circuit is shown that is identical to the op-amp circuit shown in FIG. 1, with the exception of additional current sources 20 and 30 coupled to the output of the op amp at output circuit node 14. The transistor-level implementation of the op-amp 10 is replaced by a general op-amp block. One or the other of current sources 20 and 30 are used, depending upon the direction of the current flowing in the feedback resistor network.

Current source 20 or 30 is set to be substantially equal to the current $I_F$ required by the feedback resistor network. Current source 20 or 30 therefore greatly reduces or eliminates the output current supplied by op-amp 10. In turn, the loading effect of the feedback network resistors R1 and R2 is also greatly reduced or eliminated. The following equations describe the operating condition of the op-amp circuit shown in FIG. 3:

$$I_{20} = I_F \text{ or } I_{30} = I_F \quad [7]$$

$$I_{OUT} = 0 \quad [8]$$

$$I_F = (V_{OUT} - V_{IN})/R2 = (V_{IN} - V_{REF})/R1 \quad [9]$$
$$= (V_{OUT} - V_{REF})/(R1 + R2)$$

The output current of the op-amp, $I_{OUT}$, is desirably zero or reduced to an acceptable level. In order to accomplish this, all of the current $I_F$ passing through the feedback network is ideally supplied by the current source as described by equation [9].

Current source 20 is used to source current into the feedback network. This is the case, for example, if the input voltage $V_{IN}$ is positive, and the reference voltage $V_{REF}$ is at ground. Alternate current source 30 is used to sink current from the feedback network. This is the case, for example, if the input voltage $V_{IN}$ is negative, and the reference voltage $V_{REF}$ is at ground.

Figure 4A:
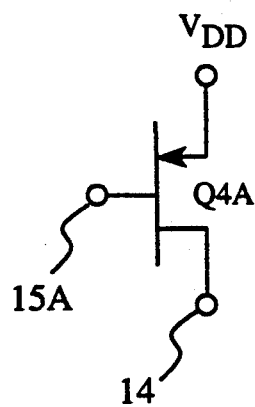
FIGS. 4A–C are alternative embodiments of the current source 20 shown in FIG. 1 for sourcing a current to the feedback network.
Figure 4B:
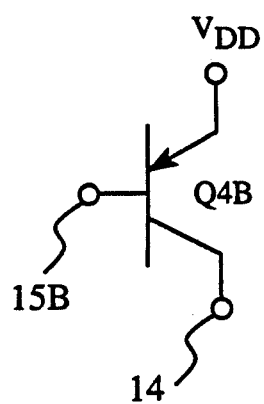
Figure 4C:
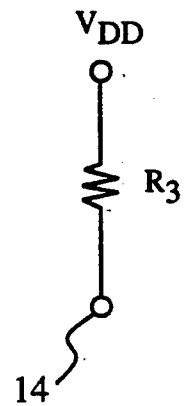

Current sources 20 and 30 shown in FIG. 3 can be implemented on a component level in various ways. FIGS. 4A–4C show three possible component-level embodiments of current source 20. Numerous other component-level embodiments are known in the art. A first embodiment of current source 20 shown in FIG. 4A is a P-channel FET Q4A with its source coupled to the positive supply $V_{DD}$ and its drain coupled to the output of the op-amp at node 14. A predetermined bias voltage is applied to the gate of FET Q4A in order to produce the desired current. A second embodiment of current source 20 shown in FIG. 4B is the bipolar equivalent of the first embodiment shown in FIG. 4A. The second embodiment of current source 20 is a PNP transistor Q4B whose emitter is coupled to the positive supply source $V_{DD}$ and whose collector is coupled to the output node of the op-amp 14. A bias voltage is applied to the base of the transistor Q4B in order to produce the desired current through the transistor. The third embodiment of current source 20 is a resistor R3 as shown in FIG. 4C. The current supplied by the resistor, however, fluctuates the power supply voltage, $V_{DD}$.

Figure 5A:
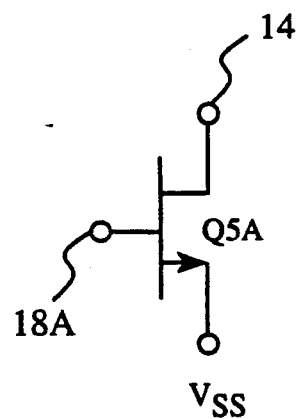
FIGS. 5A–C are alternative embodiments of the current source 30 shown in FIG. 1 for sinking a current from the feedback network.
Figure 5B:
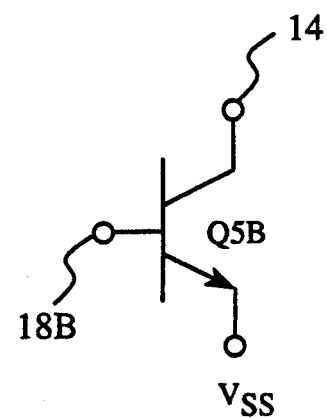
Figure 5C:
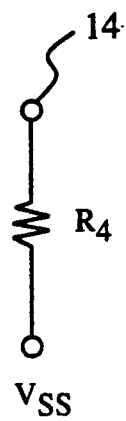

Similarly, FIGS. 5A–5C show three possible component-level embodiments of c source 30. A first embodiment of current source 30 shown in FIG. 5A is an N-channel FET Q5A with its coupled to the negative supply $V_{SS}$ and its drain to the output of the op-amp at node 14. A predetermined bias voltage is applied to the gate of FET Q5A in order to produce the desired current. A second embodiment of current source 30 shown in FIG. 5B is an NPN transistor Q5B whose emitter is coupled to the negative supply source $V_{SS}$ and whose collector is coupled to the output node of the op-amp 14. A bias voltage is applied to the base of the transistor Q5B in order to produce the desired current through the transistor. The third embodiment of current source 20 is a resistor R4 as shown in FIG. 5C.

Figure 6:
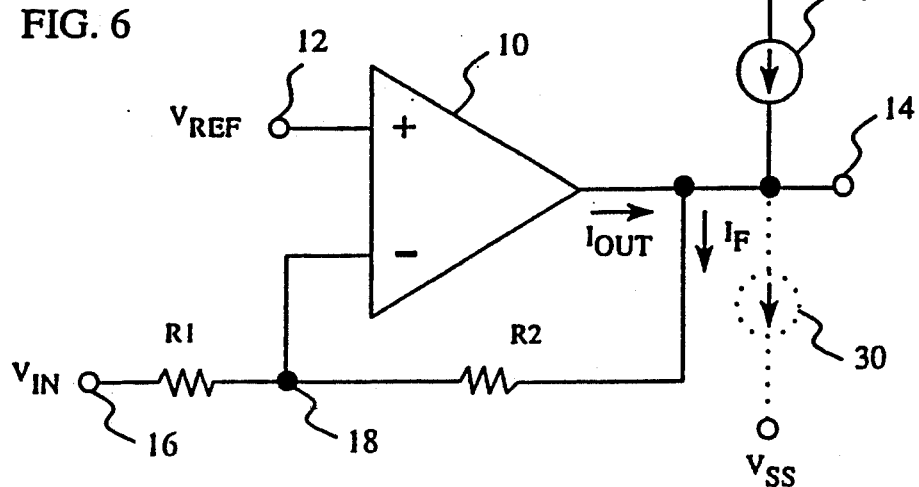
FIG. 6 is schematic of a second op-amp circuit including a current source for providing bias current to the feedback network according to the present invention.

Compensating current sources 20 and 30 can also be used in op-amp circuits that are configured as inverting amplifiers, such as the one shown in FIG. 6, or in any other op-amp circuit. In FIG. 6 the well-known inverting gain op-amp circuit is shown wherein the positive input 12 of the op-amp is coupled to ground or to a reference voltage $V_{REF}$. Feedback resistor R1 is coupled between the input voltage at node 16 and the negative input 18. Feedback resistor R2 is coupled between the negative input 18 and the output node 14. This op-amp configuration is well known in the art and, absent current sources 20 and 30 and assuming an ideal op-amp, provides the following gain expression:

$$V_{OUT} - V_{REF} = (V_{IN} - V_{REF}) \times (-R2/R1) \qquad [10]$$

While the particular equations describing the operating conditions of the inverting op-amp circuit in FIG. 6 are different from those used to describe the op-amp circuit of FIG. 3, the principle remains the same. The current provided by current sources 20 or 30 are set to be equal to the current required by the feedback network to eliminate or reduce the output current of op-amp 10.

Figure 7A:
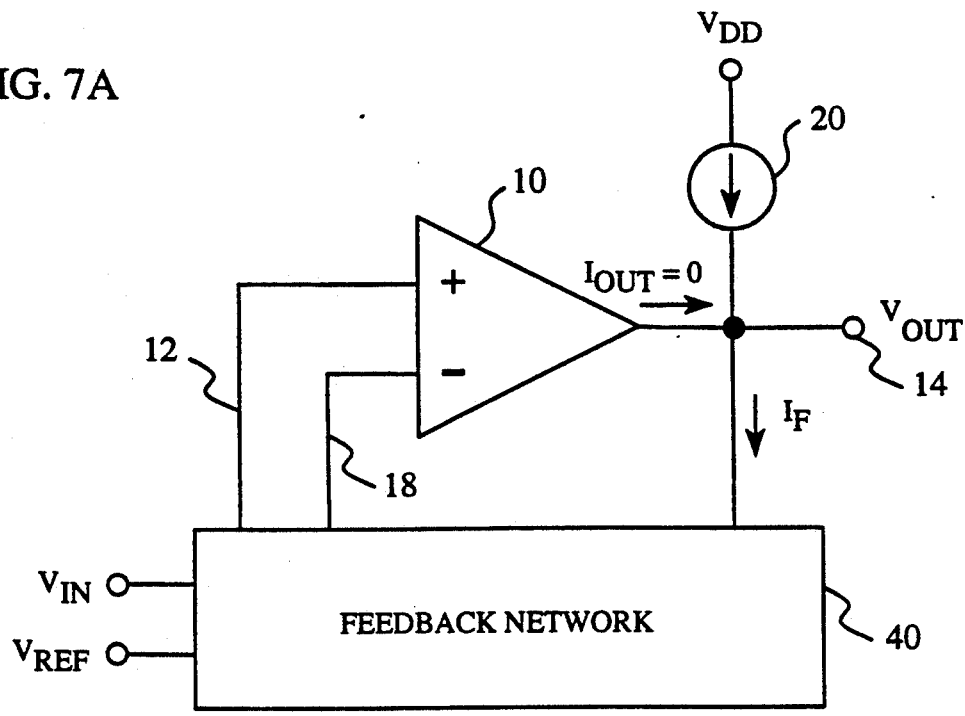
FIGS. 7A and 7B are schematic diagrams of a generalized op-amp circuit including a compensation current source according to the present invention.
Figure 7B:
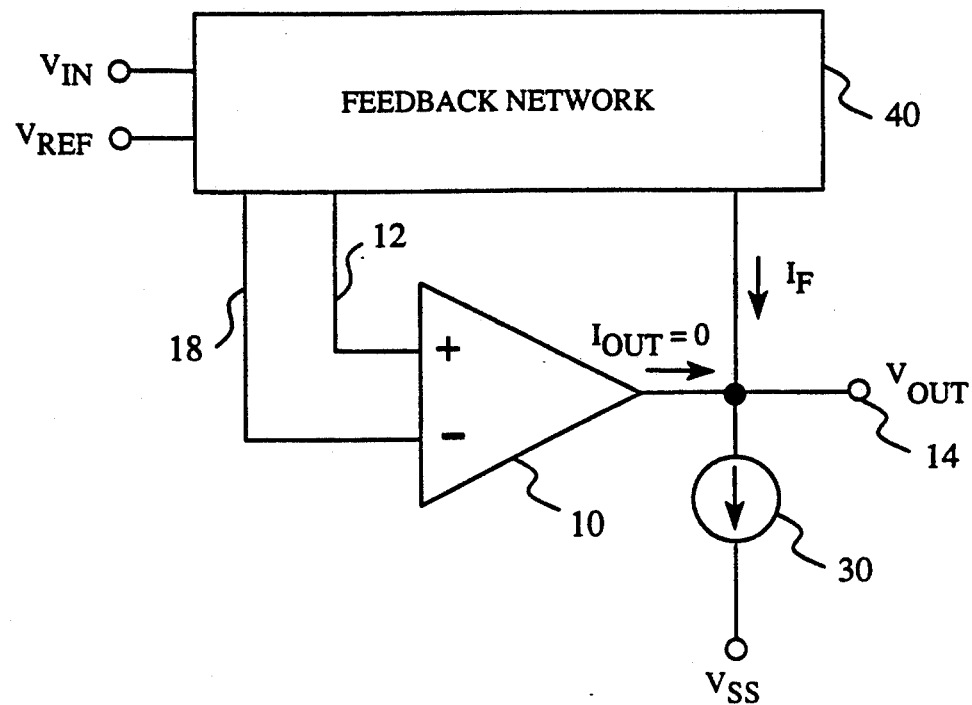

The principle of the invention is shown in a general form in block diagram form in FIGS. 7A and 7B. A generic feedback and input voltage block 40 is shown that contains the feedback resistors, input and reference voltages, as well as other voltage or current inputs and circuits as desired. The reference voltage typically used is a single ground reference voltage $V_{REF}$, but can include multiple reference voltages depending upon the application. In FIG. 7A, op-amp 10 is coupled to the generic feedback network 40 having a current requirement of $I_F$, that is substantially supplied by current source 20 coupled between the positive power supply $V_{DD}$ and the output node 14. Similarly in FIG. 7B, op-amp 10 is also coupled to generic feedback network 40, but the polarity of the required current $I_F$ is reversed. Compensating current source 30 is therefore coupled between the output node 14 and the negative power supply $V_{SS}$.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. An op-amp circuit comprising:
   an op-amp having a positive input, a negative input, and an output for providing an output voltage;
   a feedback network having a first input for receiving a fixed input reference voltage, a second input for receiving a reference voltage and first, second, and third nodes respectively coupled to the positive input, negative input, and output of the op-amp, the third node having a known operating current requirement; and
   a current source coupled to the output of the op-amp for providing a predetermined current for supplying at least a portion of the operating current requirement of the feedback network.

2. The op-amp circuit of claim 1 in which the current source provides a current substantially equal to an operating current required by the feedback network.

3. The op-amp circuit of claim 1 in which the feedback network further comprises:
   an input voltage coupled to the positive input;
   a first resistor coupled between the negative input and a reference voltage source; and
   a second resistor coupled between the negative input and the output.

4. The op-amp circuit of claim 3 in which the predetermined current is substantially equal to the output voltage minus the input voltage divided by the value of the second resistor.

5. The op-amp circuit of claim 1 in which the feedback network further comprises:
   a reference voltage coupled to the positive input;
   a first resistor coupled between the negative input and an input voltage source; and
   a second resistor coupled between the negative input and the output.

6. The op-amp circuit of claim 5 in which the predetermined current is substantially equal to the output voltage minus the reference voltage divided by the value of the second resistor.

7. The op-amp circuit of claim 1 in which the current source comprises a P-channel FET having a source coupled to a supply voltage source, a gate coupled to a predetermined bias voltage, and a drain coupled to the output.

8. The op-amp circuit of claim 1 in which the current source comprises a PNP transistor having an emitter coupled to a supply voltage source, a base coupled to a predetermined bias voltage, and a collector coupled to the output.

9. The op-amp circuit of claim 1 in which the current source comprises a resistor coupled between a supply voltage and the output.

10. The op-amp circuit of claim 1 in which the current source comprises an N-channel FET having a source coupled to a supply voltage source, a gate coupled to a predetermined bias voltage, and a drain coupled t the output.

11. The op-amp circuit of claim 1 in which the current source comprises an NPN transistor having an emitter coupled to a supply voltage source, a base coupled to a predetermined bias voltage, and a collector coupled to the output.

12. A method of accurately amplifying a voltage signal comprising:
   providing an op-amp having a positive input, a negative input, and an output for providing an output voltage;
   coupling a feedback network to the positive input, negative input and output of the op-amp, the feedback network having a known operating current requirement;
   coupling an input voltage to the feedback network; and
   coupling a current source to the output of the op-amp to provide at least a portion of the operating current requirement of the feedback network.

* * * * *